(12) United States Patent
Seo et al.

(10) Patent No.: US 10,446,638 B2
(45) Date of Patent: Oct. 15, 2019

(54) ORGANIC LIGHT EMITTING DIODE DISPLAY AND METHOD FOR MANUFACTURING THE SAME

(71) Applicant: SAMSUNG DISPLAY CO., LTD., Yongin-si, Gyeonggi-do (KR)

(72) Inventors: Jong Oh Seo, Seoul (KR); Byung Soo So, Yongin-si (KR); Dong-Min Lee, Yongin-si (KR); Dong-Sung Lee, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 16/041,968

(22) Filed: Jul. 23, 2018

(65) Prior Publication Data
US 2019/0123123 A1    Apr. 25, 2019

(30) Foreign Application Priority Data
Oct. 25, 2017    (KR) .................. 10-2017-0139521

(51) Int. Cl.
| | |
|---|---|
| *H01L 27/32* | (2006.01) |
| *H01L 51/56* | (2006.01) |
| *H01L 51/52* | (2006.01) |
| *G09G 3/3266* | (2016.01) |
| *G09G 3/3291* | (2016.01) |

(52) U.S. Cl.
CPC ....... *H01L 27/3276* (2013.01); *G09G 3/3266* (2013.01); *G09G 3/3291* (2013.01); *H01L 27/3246* (2013.01); *H01L 27/3258* (2013.01); *H01L 51/5203* (2013.01); *H01L 51/5237* (2013.01); *H01L 51/56* (2013.01)

(58) Field of Classification Search
CPC ............ H01L 27/3276; H01L 51/5237; H01L 27/3258; H01L 27/3246; H01L 51/5203; H01L 51/56; G09G 3/3291; G09G 3/3266
See application file for complete search history.

(56) References Cited

U.S. PATENT DOCUMENTS

| | | | |
|---|---|---|---|
| 2006/0003505 A1 | 1/2006 | Hwang et al. | |
| 2008/0142808 A1* | 6/2008 | Lee ........................ | H01L 27/12 257/72 |
| 2012/0326197 A1* | 12/2012 | Ohbayashi ........... | C09K 11/025 257/98 |

FOREIGN PATENT DOCUMENTS

| | | |
|---|---|---|
| KR | 10-0752381 B1 | 8/2007 |
| KR | 10-1254744 B1 | 4/2013 |
| KR | 10-2015-0065391 A | 6/2015 |

* cited by examiner

*Primary Examiner* — Kyoung Lee
(74) *Attorney, Agent, or Firm* — Kile Park Reed & Houtteman PLLC (57) ABSTRACT

An organic light emitting diode display includes a substrate, a scan line on the substrate to transfer a scan signal, a data line on the substrate to transfer a data signal, a switching transistor connected with the scan line and the data line, a driving transistor connected with the switching transistor, and an organic light emitting diode electrically connected to the driving transistor. The driving transistor may include a first semiconductor layer, the switching transistor may include a second semiconductor layer, and the first semiconductor layer may have a surface roughness that is greater than that of the second semiconductor layer.

16 Claims, 11 Drawing Sheets

ORGANIC LIGHT EMITTING DIODE DISPLAY AND METHOD FOR MANUFACTURING THE SAME

CROSS-REFERENCE TO RELATED APPLICATION

Korean Patent Application No. 10-2017-0139521, filed on Oct. 25, 2017, in the Korean Intellectual Property Office, d entitled: "Organic Light Emitting Diode Display and Method for Manufacturing the Same," is incorporated by reference herein in its entirety.

BACKGROUND

1. Field

This disclosure relates to an organic light emitting diode display and a manufacturing method thereof.

2. Description of the Related Art

An organic light emitting diode display may include two electrodes and an organic emission layer disposed therebetween. Electrons injected from a cathode as a first electrode and holes injected from an anode as a second electrode may combine in the organic emission layer to generate excitons, and the excitons may emit light while emitting energy.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting diode display, including a substrate, a scan line on the substrate to transfer a scan signal, a data line on the substrate to transfer a data signal, a switching transistor connected with the scan line and the data line, a driving transistor connected with the switching transistor, and an organic light emitting diode electrically connected to the driving transistor. The driving transistor may include a first semiconductor layer, the switching transistor may include a second semiconductor layer, and the first semiconductor layer may have a surface roughness that is greater than that of the second semiconductor layer.

The first semiconductor layer may have RMS roughness of about 9 nm to about 15 nm, and the second semiconductor layer may have RMS roughness of about 2 nm to about 7 nm.

The first semiconductor layer may have RMS roughness of about 10 nm to about 14 nm, and the second semiconductor layer may have RMS roughness of about 5 nm to about 7 nm.

The first semiconductor layer and the second semiconductor layer include a polysilicon.

The switching transistor may have an S-factor that is smaller than that of the driving transistor.

The organic light emitting diode display may further include an insulating layer that covers the first semiconductor layer and the second semiconductor layer while contacting the first semiconductor layer and the second semiconductor layer.

The organic light emitting diode display may further include an emission control line configured to transfer an emission control signal, and an emission control transistor connected with the emission control line, the driving transistor, and the organic light emitting diode.

Embodiments are also directed to a manufacturing method of an organic light emitting diode display, the method including forming an amorphous silicon layer on a substrate, forming a polysilicon layer by irradiating a first laser beam to the amorphous silicon layer, removing an oxidized layer positioned on the polysilicon layer, selectively irradiating a second laser beam to a second region of the polysilicon layer, where a second semiconductor layer of a second transistor is to be formed, while shielding a first region of the polysilicon layer, where a first semiconductor layer of a first transistor is to be formed, using a mask that exposes the second region, and forming an insulating layer on the polysilicon layer.

The selectively irradiating of the second laser beam may include disposing the mask on the polysilicon layer, and the mask may be a metal mask.

The second transistor may be a switching transistor connected with a scan line for transferring a scan signal and a data line for transferring a data signal, and the first transistor may be a driving transistor connected with the switching transistor.

The second region of the polysilicon layer may be re-crystallized after being melted by irradiating the second laser beam thereto.

The first region of the polysilicon layer may have RMS roughness of about 9 nm to about 15 nm, and the second region of the polysilicon layer where the second semiconductor layer may have RMS roughness of about 2 nm to about 7 nm after being re-crystallized.

Density of the second laser beam may be about 80% to about 100% of density of the first laser beam.

The removing of the oxidized layer may be performed by using a hydrogen fluoride solution.

According to the example embodiments, it is possible to improve switching capability of a switching transistor while maintaining a driving range of the driving transistor.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the specification, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

Figure 1:
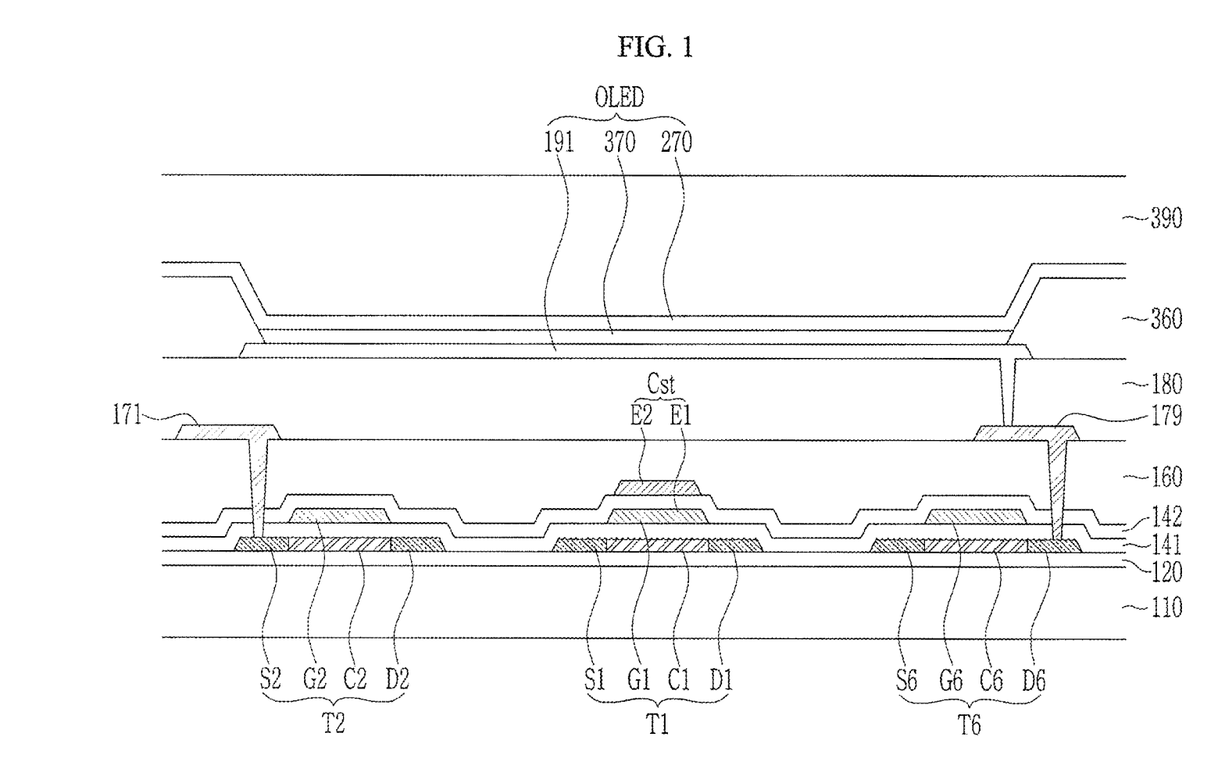
FIG. 1 illustrates a schematic cross-sectional view of an organic light emitting diode display according to an example embodiment.
Figure 2:
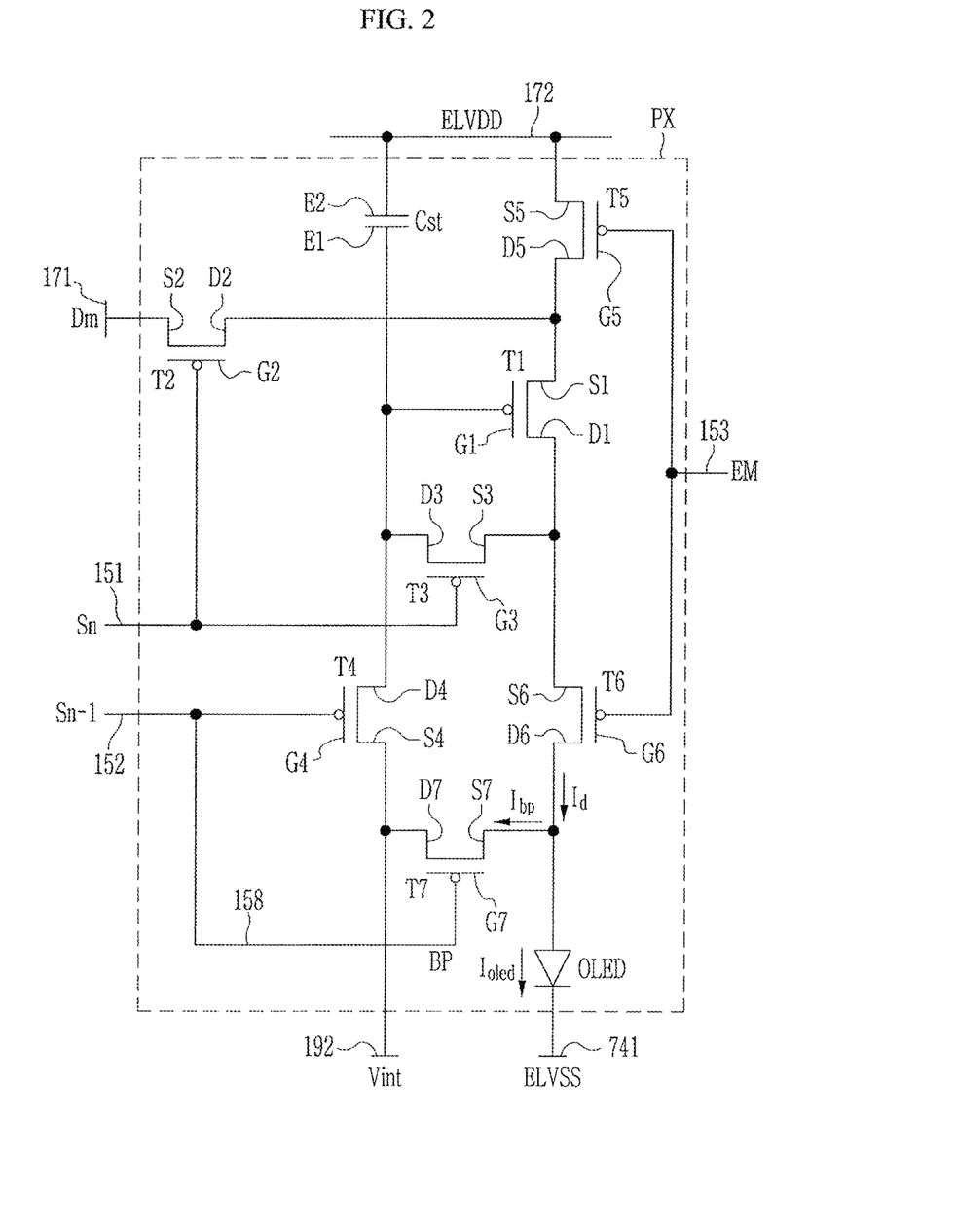
FIG. 2 illustrates an equivalent circuit diagram of one pixel of an organic light emitting diode display according to an example embodiment.

FIG. 1 is a schematic cross-sectional view illustrating an organic light emitting diode display according to an example embodiment, and FIG. 2 is an equivalent circuit diagram illustrating one pixel of an organic light emitting diode display according to an example embodiment.

FIG. 1 schematically illustrates a cross-sectional structure of a region corresponding to one pixel PX of the organic light emitting diode display, specifically illustrating a driving transistor T1, a switching transistor T2, an emission control transistor T6, a storage capacitor Cst, and an organic light emitting diode OLED among constituent elements of the pixel illustrated in FIG. 2.

Referring to FIG. 1 and FIG. 2, the organic light emitting diode display according to the present example embodiment includes a plurality of pixels PX positioned on a substrate 110. Each pixel PX may include, for example, transistors T1, T2, T3, T4, T5, T6, and T7, a storage capacitor Cst, and an organic light emitting diode OLED connected with various signal lines 151, 152, 153, 158, 171, 172, and 192.

The organic light emitting diode display may include a display area (corresponding to a screen for displaying an image) and a non-display area. The pixels PX may be arranged in the display area in, e.g., a matrix form, and drivers (such as a gate driver, an emission controller, a data driver, and a signal controller) for operating the pixels PX may be positioned in the non-display area.

The transistors may include, for example, the driving transistor T1, the switching transistor T2, the compensation transistor T3, the initialization transistor T4, the operation control transistor T5, the emission control transistor T6, and/or the bypass transistor T7, etc. Each of the transistors may include a semiconductor layer including a source electrode, a drain electrode, and a channel, and a gate electrode.

For example, in the example embodiment shown in FIG. 1, the driving transistor T1 includes a semiconductor layer including a source electrode S1, a drain electrode D1, and a channel C1, and a gate electrode G1. The switching transistor T2 includes a semiconductor layer including a source electrode S2, a drain electrode D2, and a channel C2, and a gate electrode G2. The emission control transistor T6 includes a semiconductor layer including a source electrode S6, a drain electrode D6, and a channel C6, and a gate electrode G6. In each of the transistors T1, T2, and T6, the channels C1, C2, and C6 are positioned between the source electrodes S1, S2, and S6 and the drain electrodes D1, D2, and D6, and the gate electrodes G1, G2, and G6 overlap the channels C1, C2, and C6. The semiconductor layers of the transistors may include, for example, polysilicon formed by crystallizing amorphous silicon.

As described in further detail below in connection with FIGS. 3-7, according to an example embodiment, a surface of the semiconductor layer of the switching transistor T2 may be flatter than that of the semiconductor layer of the driving transistor T1. For example, surface roughness of the semiconductor layer of the switching transistor T2 may be less than that of the semiconductor layer of the driving transistor T1. For example, the switching transistor T2 may have root mean square (RMS) roughness of 2 nm to 7 nm, 5 nm to 7 nm, or 5 nm to 6 nm, and the driving transistor T1 may have RMS roughness of 9 nm to 15 nm, 10 nm to 14 nm, or 10 nm to 12 nm. The RMS roughness may be obtained by, for example, AFM (atomic force microscope) surface roughness analysis. A small RMS roughness of the semiconductor layer indicates a low height of a protrusion of a surface of the semiconductor layer. The protrusion of the surface of the semiconductor layer may be formed, for example, as the result of a phase change (e.g., solid, liquid, and solid) that occurs during crystallization of amorphous silicon.

A small roughness may help to reduce an electric field concentrated on the protrusion of the surface of the semiconductor layer, and an amount of charge trapped at an interface between the semiconductor layer and the insulating layer near a grain boundary may be reduced to generally decrease an interface trap charge. When the interface trap charge is decreased, an interface trap density may be reduced to decrease an S-factor. The S-factor, which is a current-voltage characteristic of a transistor, indicates a magnitude (amount of change) of a gate voltage required to increase the drain current by 10 times when the gate voltage equal to or smaller than a threshold voltage is applied to the transistor. The S-factor may be referred to as a sub-threshold slope.

According to the present example embodiment, the S-factor of the driving transistor T1 is relatively large, and the S-factor of the switching transistor T2 is relatively small. The differences in S-factors may be formed by implementing a difference in the surface roughness between the semiconductor layers of the driving transistor T1 and the switching transistor T2. Accordingly, the driving transistor T1 may have a wide driving range, and the switching transistor T2 may have a quick switching characteristic. In the switching transistor T2, it may be advantageous to have a smaller S-factor for a quick driving speed. In the driving transistor T1, it may be advantageous to have a larger S-factor for gray expression.

The semiconductor layers of other transistors, for example transistors T3, T4, T5, T6, and T7, may have an RMS roughness that is similar to that of the semiconductor layer of the driving transistor T1 or similar to that of the switching transistor T2.

Hereinafter, a cross-sectional structure of an organic light emitting diode display according to an example embodiment will be described depending on a stacked order thereof with reference to FIG. 1, and a connection relationship and operation of an organic light emitting diode display according to an example embodiment will be described in view of circuits with reference to FIG. 2. In the cross-sectional structure, the operation control transistor T5, the compensation transistor T3, the initialization transistor T4, the operation control transistor T5, and the bypass transistor T7 may have a substantially same stacked structure as that of the emission control transistor T6, and a detailed description thereof will be omitted.

Referring to FIG. 1, in the present example embodiment, a buffer layer 120 is on the substrate 110. The substrate 110 may be made of an insulating material such as plastic, glass, quartz, or ceramic. The buffer layer 120 may serve to block impurities that may diffuse from the substrate 110 into the semiconductor layer while the semiconductor layer is formed to reduce a stress of the substrate 110, and may include, for example, an inorganic insulating material.

A semiconductor layer of the driving transistor T1 (which includes a source electrode S1, a drain electrode D1, and a channel C1), a semiconductor layer of the switching transistor T2 (which includes a source electrode S2, a drain electrode D2, and a channel C2), and a semiconductor layer of the emission control transistor T6 (which includes a source electrode S6, a drain electrode D6, and a channel C6) are on the buffer layer 120. In the present example embodiment, the semiconductor layer of the switching transistor T2 may have a surface roughness that is less than that of the semiconductor layer of the driving transistor T1.

A first insulating layer 141 may cover the semiconductor layers. Gate electrodes G1, G2, and G6 may be disposed on the first insulating layer 141. One or more of a scan line 151, a previous-stage scan line 152, an emission control line 153, or a bypass control line 158 illustrated in FIG. 2 may be positioned at a same layer as that of the gate electrodes G1, G2, and G6. The gate electrode G1 of the driving transistor T1 may be used as a first storage electrode E1 of the storage capacitor Cst. A second insulating layer 142 may cover the gate electrodes G1, G2, and G6. The first and second insulating layers 141 and 142 may include, for example, an inorganic insulating material such as a silicon nitride (SiNx) or a silicon oxide (SiOy).

A second storage electrode E2 of the storage capacitor Cst may be disposed on the second insulating layer 142, and a third insulating layer 160 may be disposed on the second storage electrode E2. The third insulating layer 160 may include, for example, an inorganic insulating material such as a silicon nitride (SiNx) or a silicon oxide (SiOy), an organic insulating material, etc.

A data line 171 and a data connecting member 179 may be disposed on the third insulating layer 160. The data line 171 may be connected with the source electrode S2 of the switching transistor T2 through a contact hole formed in the first, second, and third insulating layers 141, 142, and 160. The data connecting member 179 may be connected with the drain electrode D2 of the emission control transistor T6 through a contact hole formed in the first, second, and third insulating layers 141, 142, and 160. A driving voltage line 172 illustrated in FIG. 2 may be positioned at a same layer as that of the data line 171.

A planarization layer 180 may be disposed on the data line 171 and the data connecting member 179. The planarization layer 180 may include, for example, an organic insulating material. A pixel electrode 191 may be positioned on the planarization layer 180. The pixel electrode 191 may be connected with the data connecting member 179 through a contact hole formed in the planarization layer 180. An initialization voltage line 192 illustrated in FIG. 2 may be positioned at a same layer as that of the pixel electrode 191.

A pixel definition layer 360 having an opening that overlaps the pixel electrode 191 may be positioned on the planarization layer 180. The pixel definition layer 360 may include, for example, an organic insulating material or an inorganic insulating material.

An organic emission layer 370 may be positioned on the pixel electrode 191, and a common electrode 270 may be positioned on the organic emission layer 370. The pixel electrode 191, the organic emission layer 370, and the common electrode 270 may constitute an organic light emitting diode OLED. The pixel electrode 191 may be an anode, which is a hole-injection electrode, and the common electrode 270 may be a cathode, which is an electron-injection electrode. Holes and electrons may be injected into the organic light emitting layer 370 from the pixel electrode 191 and the common electrode 270, and light may be emitted when excitons obtained by combining the injected holes and electrons transition from an excited state to a ground state.

An encapsulation layer 390 for protecting the organic light emitting diode OLED may be disposed on the common electrode 270. The encapsulation layer 390 may be, for example, a thin film encapsulation layer in which an inorganic film and an organic film are stacked.

Referring to FIG. 2, the signal lines may include the scan line 151, the previous-stage scan line 152, the emission control line 153, the bypass control line 158, the data line 171, the driving voltage line 172, and the initialization voltage line 192.

In the circuit illustrated in FIG. 2, the scan line 151 is connected with a gate driver to transfer a scan signal Sn to the switching transistor T2 and the compensation transistor T3. The previous-stage scan line 152 is connected with the gate driver to transfer a previous-stage scan signal Sn-1 to the initialization transistor T4. The emission control line 153 is connected with an emission controller (not illustrated) to transfer an emission control signal EM to the operation control transistor T5 and the emission control transistor T6. The bypass control line 158 transfers a bypass signal BP to the bypass transistor T7.

The data line 171 transfers a data signal Dm generated in the data driver, and the driving voltage line 172 transfers a driving voltage ELVDD. The initialization voltage line 192 transfers an initialization voltage Vint for initializing the driving transistor T1.

The driving transistor T1 is connected with the first storage electrode E1 of the storage capacitor Cst. The source electrode S1 of the driving transistor T1 is connected with the driving voltage line 172 via the operation control transistor T5. The drain electrode D1 of the driving transistor T1 is connected with the anode of the organic light emitting diode OLED via the emission control transistor T6. The driving transistor T1 receives a data signal Dm depending on a switching operation of the switching transistor T2 to transfer a driving current Id to the organic light emitting diode OLED.

The switching transistor T2 has the gate electrode G2 connected with the scan line 151 and the source electrode S2 connected with the data line 171. The drain electrode D2 of the switching transistor T2 is connected with the source electrode S1 of the driving transistor T1, and is connected with the connected with the operation control transistor T5 via the driving voltage line 172. When the switching transistor T2 is turned on depending on the scan signal Sn transferred through the scan line 151, the data signal Dm transferred through the data line 171 is transferred to the source electrode S1 of the driving transistor T1.

The compensation transistor T3 has the gate electrode G3 connected with the scan line 151, and the source electrode S3 connected with the drain electrode D1 of the driving transistor T1 and the source electrode S6 of the emission control transistor T6. The drain electrode D3 of the compensation transistor T3 is connected with the drain electrode D4 of the initialization transistor T4, the first storage electrode E1 of the storage capacitor Cst, and the gate electrode G1 of the driving transistor T1. The compensation transistor T3 is turned on depending on the scan signal Sn transferred through the scan line 151 to connect the gate electrode G1 and the drain electrode D1 of the driving transistor T1, i.e., to diode-connect the driving transistor T1.

The initialization transistor T4 has the gate electrode G4 connected with the previous-stage scan line 152, and the source electrode S4 connected with the initialization voltage line 192. The drain electrode D4 of the initialization transistor T4 is connected with the first storage electrode E1 of the storage capacitor Cst and the driving gate electrode G1 of the driving transistor T1. The initialization transistor T4 is turned on depending on the previous-stage scan signal Sn-1 transferred through the previous-stage scan line 152 to transfer the initialization voltage Vint to the gate electrode G1 of the driving transistor T1. Accordingly, the gate voltage of the gate electrode G1 of the driving transistor T1 is initialized.

The operation control transistor T5 has the gate electrode G5 connected with the emission control line 153, and the source electrode S5 connected with the driving voltage line 172. The drain electrode D5 of the operation control transistor T5 is connected with the source electrode S1 of the driving transistor T1 and the drain electrode D2 of the switching transistor T2. The emission control transistor T6 has the gate electrode G6 connected with the emission control line 153, and the drain electrode D6 connected with the anode of the organic light emitting diode OLED. The source electrode S6 of the emission control transistor T6 is connected with the drain electrode D1 of the driving transistor T1 and the source electrode S3 of the compensation transistor T3. The operation control transistor T5 and the emission control transistor T6 are simultaneously turned on depending on the emission control signal EM transferred through the emission control line 153, and thus the driving voltage ELVDD is compensated by the diode-connected driving transistor T1 to be transferred to the organic light emitting diode OLED.

The bypass transistor T7 has the gate electrode G7 connected with the bypass control line 158, the source electrode S7 connected with the drain electrode D6 of the emission control transistor T6 and the anode of the organic light emitting diode OLED, and the drain electrode D7 connected with the initialization voltage line 192 and the source electrode S4 of the initialization transistor T4. The bypass control line 158 may be connected with the previous-stage scan line 152.

The second storage electrode E2 of the storage capacitor Cst is connected with the driving voltage line 172. The cathode of the organic light emitting diode OLED is connected with a common voltage line 741 for transferring a common voltage ELVSS.

For operation of one pixel of the organic light emitting diode display according to the present example embodiment, a previous-stage scan signal Sn-1 of a low level may be supplied to the pixel PX through the previous-stage scan line 152 during an initialization period. Then, the initialization transistor T4 may be turned on depending on the previous-stage scan signal Sn-1 of a low level, and the initialization voltage Vint may be applied from the initialization voltage line 192 to the gate electrode G1 of the driving transistor T1 through the initialization transistor T4 to thereby initialize the driving transistor T1.

Next, the scan signal Sn of a low level may be supplied to the pixel PX through the scan line 151 during a data programming period. Then, the switching transistor T2 and the compensation transistor T3 may be turned on depending on the scan signal Sn of a low level, and the driving transistor T1 may be diode-connected by the turned-on compensation transistor T3 to be biased in a forward direction. Then, a compensation voltage Dm+Vth (Vth being a negative value) (obtained by reducing a threshold voltage Vth of the driving transistor T1 from the data signal Dm transferred through the data line 171) may be applied to the gate electrode G1 of the driving transistor T1. The driving voltage ELVDD and the compensation voltage Dm+Vth may be applied to two storage electrodes E1 and E2 of the storage capacitor Cst, and a charge corresponding to a difference between the two storage electrodes E1 and E2 may be stored in the storage capacitor Cst.

Next, the emission control signal EM supplied from the emission control line 153 may be changed from a high level to a low level such that the operation control transistor T5 and the emission control transistor T6 are turned on by the emission control signal EM of a low level during an emission period. Then, a driving current Id may be generated depending on a voltage difference between a gate voltage of the gate electrode G1 of the driving transistor T1 and the driving voltage ELVDD, and the driving current Id may be supplied to the organic light emitting diode OLED through the emission control transistor T6. During the emission period, the gate-source voltage Vgs of the driving transistor T1 may be maintained by the storage capacitor Cst as "(Dm+Vth)−ELVDD", and the driving current Id may be proportional to "(Dm-ELVDD)2" obtained by square of a value obtained by subtracting the threshold voltage Vth from the gate-source voltage Vgs depending on a current-voltage relationship of the driving transistor T1. Accordingly, the driving current Id may be determined regardless of the threshold voltage Vth of the driving transistor T1, and thus it may be possible to ameliorate non-uniformity of the characteristic of the driving transistor T1, which may occur due to process dispersion, for example.

The bypass transistor T7 may disperse some of a minimum current of driving transistor T1 (i.e., a current in a condition where the driving transistor T1 is turned off because the gate-source voltage Vgs of the driving transistor T1 is smaller than the threshold voltage Vth) as a bypass current Ibp in currents other than a current path at a side of the organic light emitting diode. Accordingly, a black gray may be more precisely displayed, and a contrast ratio may be improved.

In the example embodiment of FIG. 2, the pixel circuit includes seven transistors and one capacitor, but the number of the transistors, a number of the capacitors, and their connection relationships, and a driving method thereof, may be variously modified.

Hereinafter, a manufacturing method of an organic light emitting diode display will be described with reference to FIG. 3 to FIG. 7.

FIG. 3 to FIG. 7 are process cross-sectional views illustrating a manufacturing process of an organic light emitting diode display according to an example embodiment.

Figure 3:
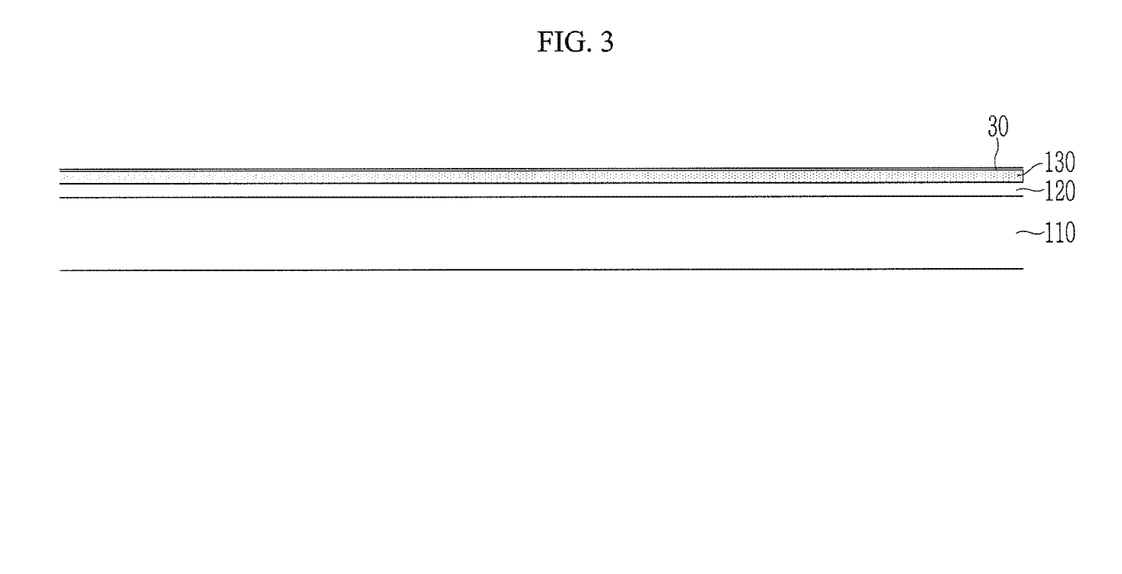
FIG. 3 to FIG. 7 illustrate process cross-sectional views of stages in a manufacturing process of an organic light emitting diode display according to an example embodiment.

Referring to FIG. 3, the buffer layer 120 may be formed on the substrate 110, and then an amorphous silicon layer 130 may be formed. An oxidized layer 30 may be spontaneously formed on a surface of amorphous silicon layer 130.

Figure 4:
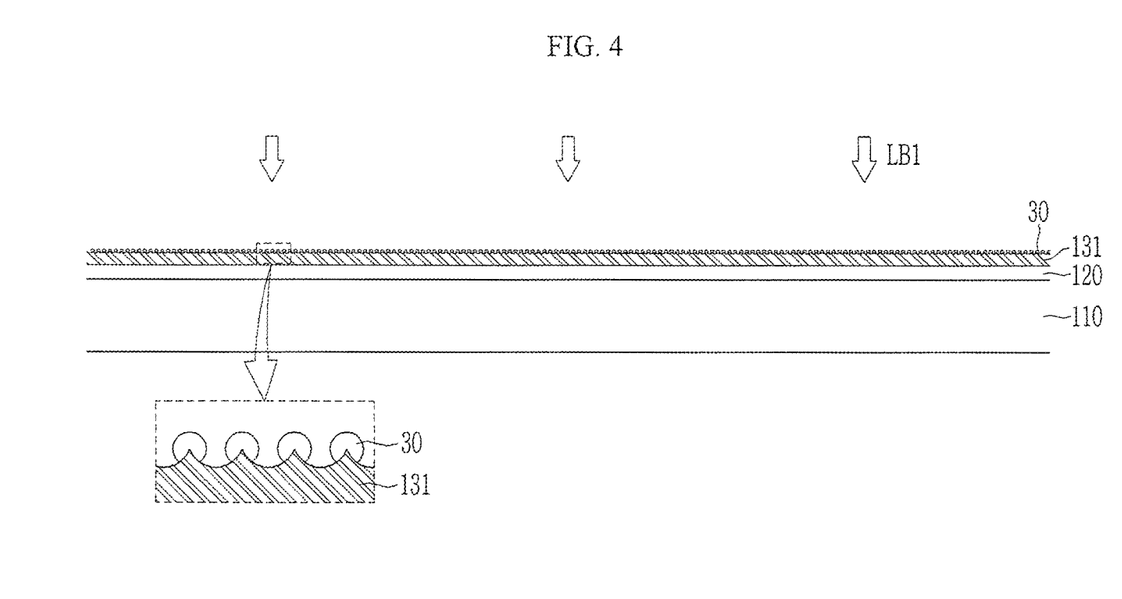

Referring to FIG. 4, a polysilicon layer 131 may be formed by, for example, irradiating a first excimer laser beam LB1 to the amorphous silicon layer 130. The polysilicon layer 131 may be formed by melting and solidifying the amorphous silicon layer 130 by the first excimer laser beam LB1. In this case, the oxidized layer 30 may be melted and then solidified, and, as shown in the inset in FIG. 4, protrusions may be formed corresponding to grain boundaries of the polysilicon layer 131. The oxidized layer 30 may be positioned to correspond to the protrusions. A height of the protrusions corresponding to the grain boundary of the polysilicon layer 131 may be a height from a lower surface of the polysilicon layer 131 to a peak of the protrusions of the polysilicon layer 131. In addition, the height may be a thickness of the polysilicon layer 131.

A width of the first excimer laser beam LB1 may be, for example, in a range of 450 μm to 510 μm. An energy density of the first excimer laser beam LB1 may be, for example, in a range of 405 mJ/cm$^2$ to 425 mJ/cm$^2$. The first excimer laser beam LB1 may be irradiated to the amorphous silicon layer 130 so as to be overlapped therewith by, for example, 80% to 95% in one direction. A scan pitch of the first excimer laser beam LB1 in one direction may be, for example, in a range of 20 μm to 40 μm.

Figure 5:
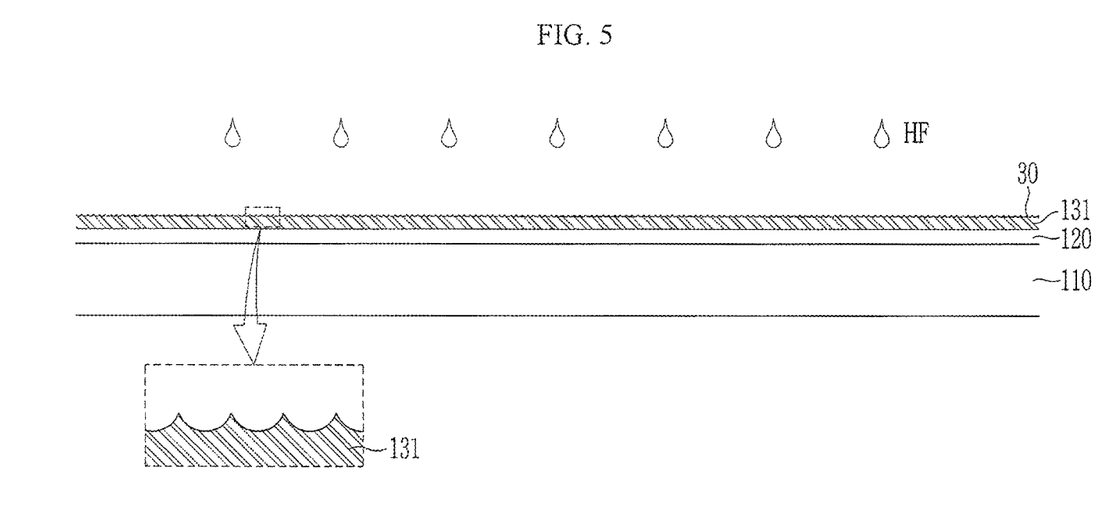

Referring to FIG. 5, the oxidized layer 30 positioned on the polysilicon layer 131 may be removed. For example, the oxidized layer 30 may be removed by applying a hydrogen fluoride (HF) solution having a concentration of 0.5% to the polysilicon layer 131 for about 30 to 180 seconds, and the polysilicon layer 131 may be washed with deionized water and hydrogen water. Referring to the inset in FIG. 5, the height of the protrusions corresponding to the grain boundaries of the polysilicon layer 131 may be reduced in the course of removing the oxidized layer 30.

Figure 6:
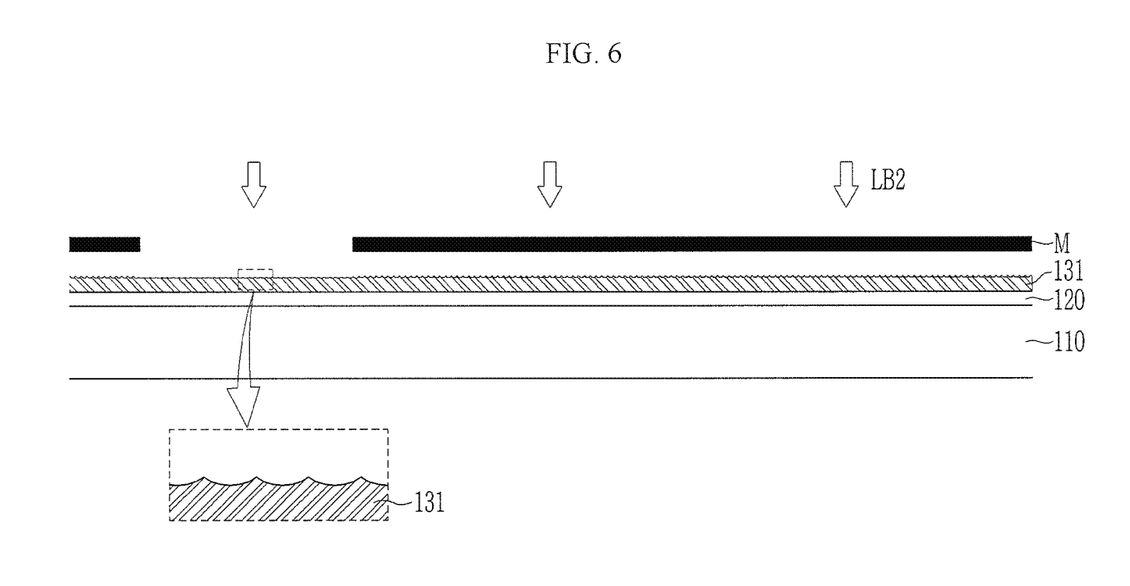

Referring to FIG. 6, a mask M for shielding a first region (in which the semiconductor layer of the driving transistor T1 is to be formed) and for exposing a second region (in which the semiconductor layer of the switching transistor T2 is to be formed) may be disposed on or adjacent to the polysilicon layer 131. The mask M may be, for example, a metal mask.

Next, a second excimer laser beam LB2 may be irradiated onto the mask M. The second excimer laser beam LB2 may be selectively irradiated onto the second region of the semiconductor layer of the switching transistor T2 in the polysilicon layer 131. In the polysilicon layer 131, the region onto which the second excimer laser beam LB2 is irradiated, i.e., the second region of the semiconductor layer of the switching transistor T2, is re-crystallized after being melted. In this case, the oxidized layer 30 may be removed, and a tension caused by the oxidized layer 30 may be removed at a time of the recrystallization. Further, as shown in the inset in FIG. 6, a height of the protrusions corresponding to the grain boundaries of the polysilicon layer 131 may be further reduced. Accordingly, surface roughness of the re-crystallized second region of the polysilicon layer 131 may be smaller than that of other regions such as the first region.

A width of the second excimer laser beam LB2 may be, for example, in a range of 450 μm to 510 μm. An energy density of the second excimer laser beam LB2 may be, for example, in a range of 324 mJ/cm$^2$ to 425 mJ/cm$^2$, and may be, for example, 80% to 100% of the energy density of the first excimer laser beam LB1. An energy density of the second excimer laser beam LB2 may be, for example, in a range of 340 mJ/cm$^2$ to 425 mJ/cm$^2$. The second excimer laser beam LB2 may be irradiated to the polysilicon layer 131 so as to be overlapped therewith by, for example, 78% to 96% in one direction. A scan pitch of the second excimer laser beam LB2 in one direction may be, for example, in a range of 5 μm to 120 μm.

Figure 7:
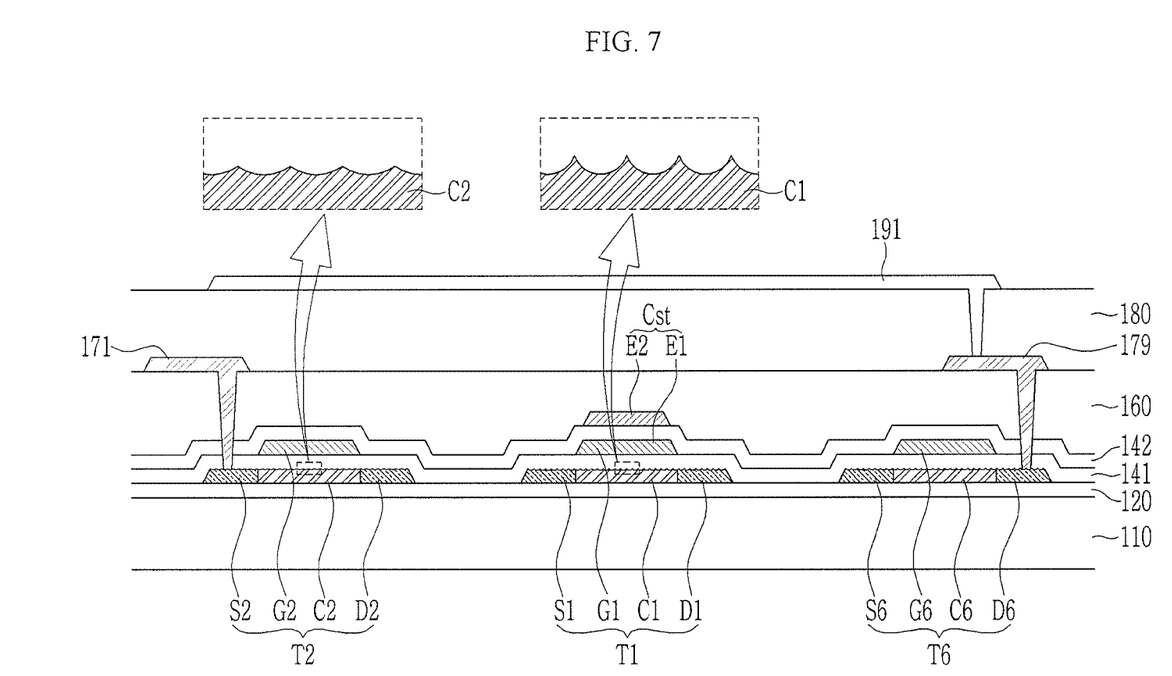

Referring to FIG. 7, semiconductor layers such as the driving transistor T1, the switching transistor T2, and the emission control transistor T6 may be formed by patterning the polysilicon layer 131. The first insulating layer 141 may be formed on the semiconductor layers, gate electrodes G1, G2, and G6 may be formed on the first insulating layer 141, and source electrodes S1, S2, and S6 and drain electrode D1, D2, and D6 may be formed by, for example, doping the semiconductor layers using the gate electrodes G1, G2, and G6 as a mask. In the semiconductor layers, non-doped regions may be channels C1, C2, and C6.

Next, an organic light emitting diode display such as that illustrated in FIG. 1 may be manufactured by forming and/or patterning layers on the gate electrodes G1, G2, and G6 in a general manner.

In the organic light emitting diode display manufactured as described above, the semiconductor layer of the driving transistor T1 is not re-crystallized as a result of shielding the second excimer laser beam LB2 by the mask M, and thus the protrusions may remain in a state as illustrated in FIG. 5. On the other hand, the semiconductor layer of the switching transistor T2 is re-crystallized by the second excimer laser beam LB2, and thus the protrusions may be in a lowered state as illustrated in FIG. 6. Accordingly, the S-factor of the switching transistor T2 may be selectively reduced while maintaining the S-factor of the driving transistor T1, and thus it may be possible to improve performance of the organic light emitting diode display. When the protrusions are lowered to reduce the surface roughness, transistor mobility may be increased. Thus, it may be possible to improve a switching characteristic of the switching transistor T2.

An experimental result showing an effect of applying the second excimer laser beam LB2 of the polysilicon layer 131 will be described with reference to FIG. 8A to FIG. 8C and FIG. 9.

Figure 8A:
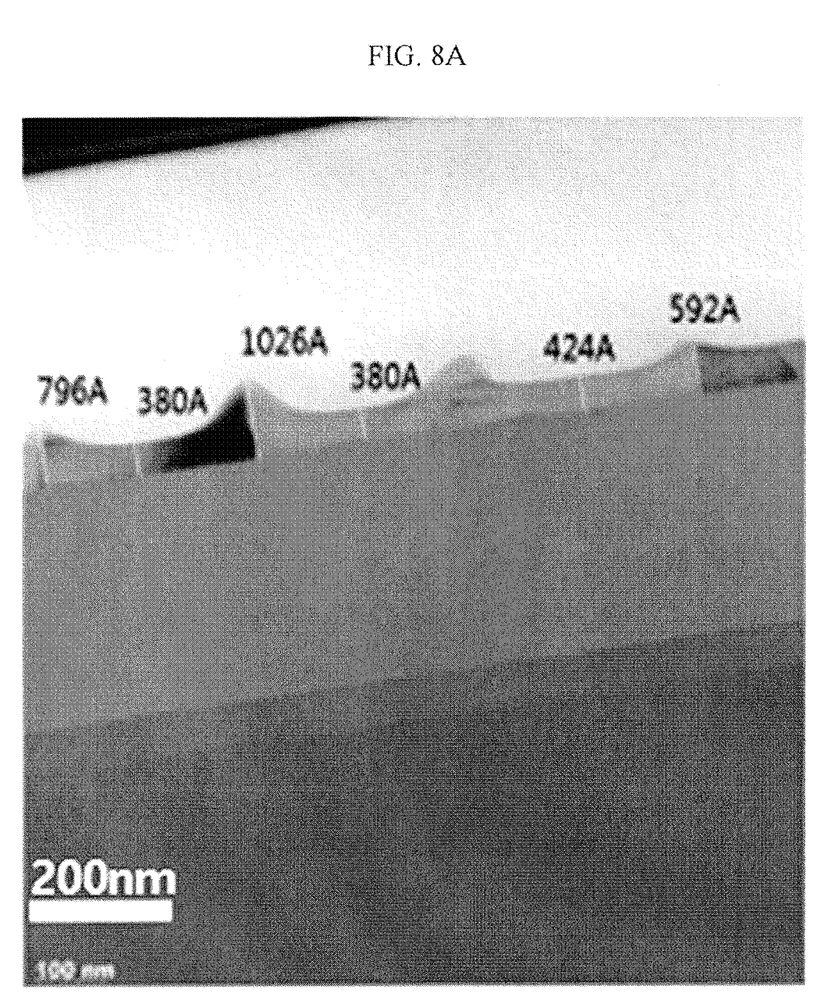
FIG. 8A to FIG. 8C illustrate electron micrographs of a polysilicon layer.
Figure 8B:
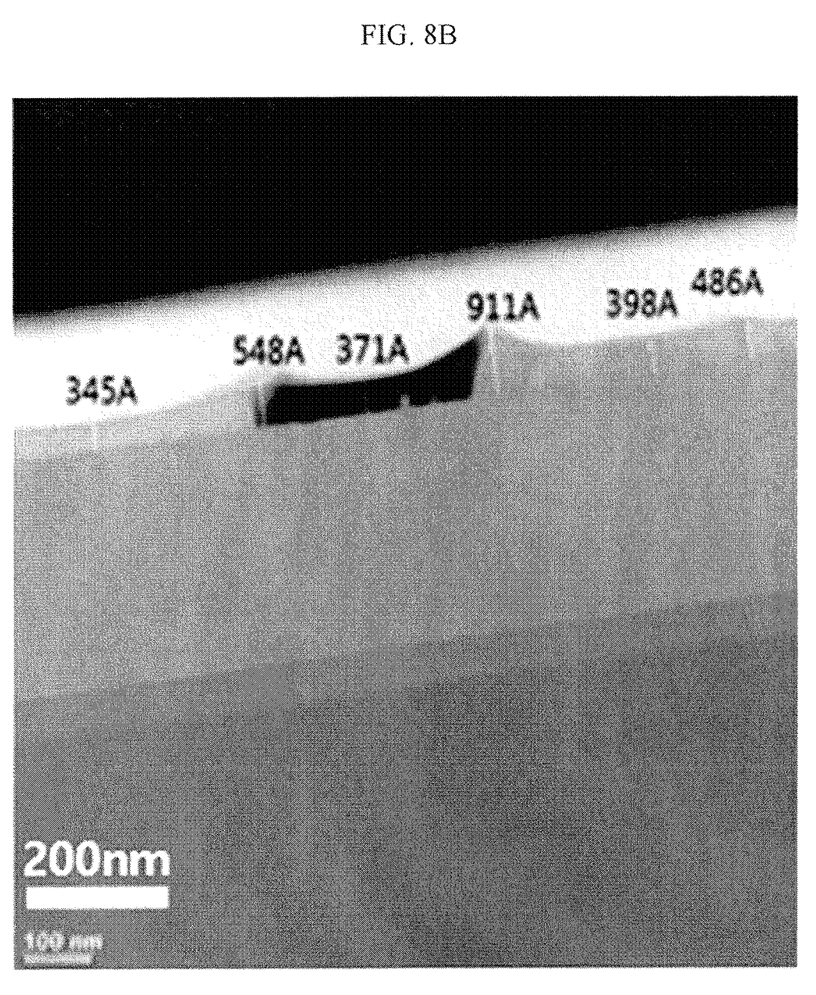
Figure 8C:
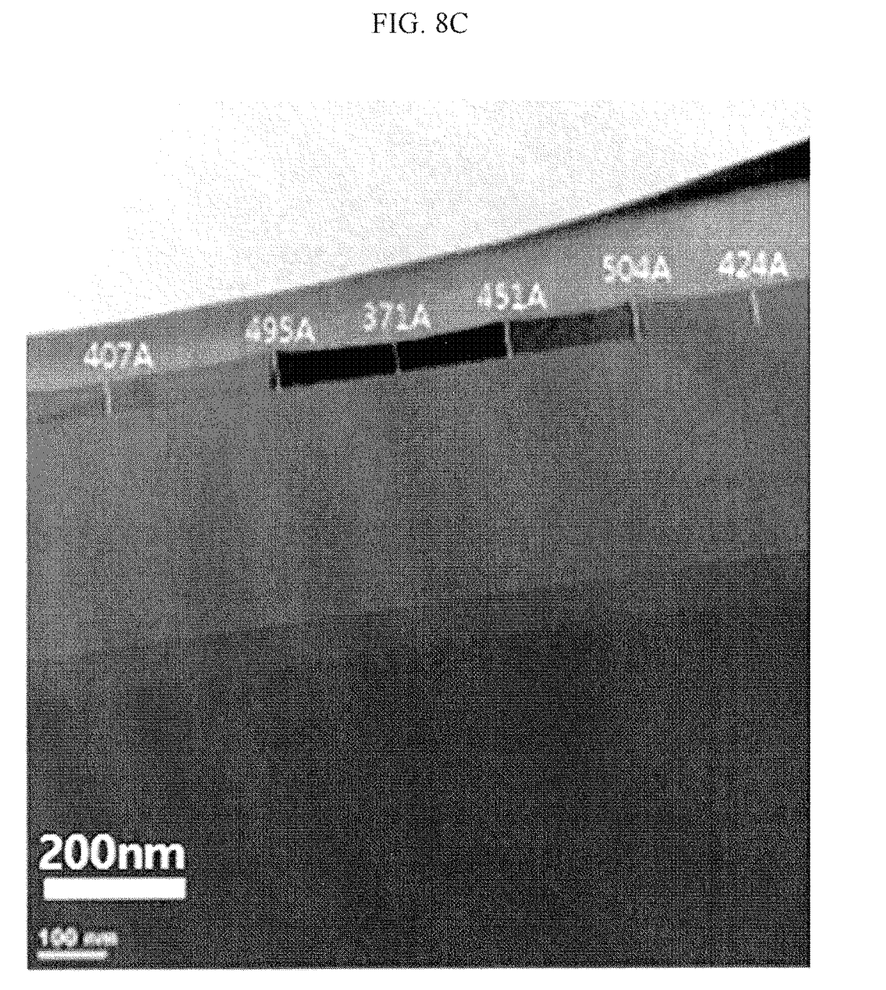
Figure 9:
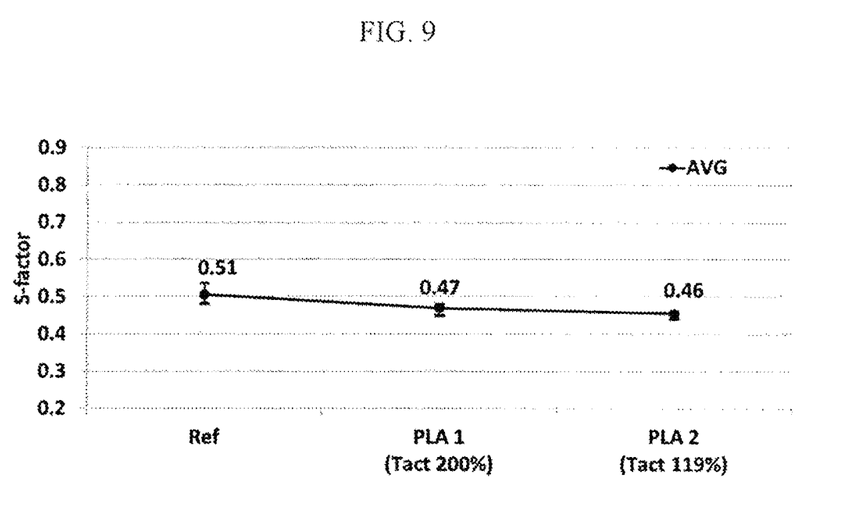
FIG. 9 illustrates a graph of an S-factor of a transistor including a polysilicon layer.

FIG. 8A to FIG. 8C are electron micrographs illustrating a polysilicon layer, and FIG. 9 is a graph illustrating an S-factor of a transistor including a polysilicon layer.

FIG. 8A is a photograph illustrating a polysilicon layer formed by irradiating the aforementioned first excimer laser beam LB1 to the amorphous silicon layer, FIG. 8B is a photograph illustrating the polysilicon layer from which the oxidized layer is removed, and FIG. 8C is a photograph illustrating the polysilicon layer re-crystallized by irradiating the aforementioned second excimer laser beam LB2 to the polysilicon layer from which the oxidized layer is removed.

Referring to FIGS. 8A, 8B, and 8C, it is seen that maximum heights of the protrusions of the polysilicon layer are reduced to 1026 Å, 911 Å, and 504 Å in FIG. 8A, FIG. 8B, and FIG. 8C. A height of a central portion of the grain as an average minimum height of the polysilicon layer is hardly changed in FIG. 8A, FIG. 8B, and FIG. 8C. However, an average maximum height, i.e., an average height of the protrusions corresponding to the grain boundary, is about 800 Å, 650 Å, and 500 Å. Accordingly, it is seen that the surface roughness of the amorphous silicon layer is reduced depending on the removal and re-crystallization of the oxidized layer. This indicates that the surface roughness of the semiconductor layer of the switching transistor T2 is smaller than the surface roughness of the semiconductor layer of the driving transistor T1 in the aforementioned organic light emitting diode display according to the present example embodiment.

Referring to FIG. 9, the label Ref indicates an S-factor of the transistor including the polysilicon layer formed by irradiating the first excimer laser beam LB1 to the amorphous silicon layer, and the labels PLA1 and PLA2 indicate S-factors of the transistors including the polysilicon layer re-crystalized by irradiating the second excimer laser beam LB2 to the polysilicon layer from which the oxidized layer is received. PLA1 and PLA2 are different in terms of process time. The former indicates a case where an irradiation time per unit area of the second excimer laser beam LB2 is 200% of that per unit area of the first excimer laser beam LB1, and the latter indicates a case of 119%. It is seen that the S-factor of the transistor including the polysilicon layer re-crystalized by irradiating the second excimer laser beam LB2 is reduced as compared with the Ref. This indicates that the S-factor of the switching transistor T2 is smaller than that of the driving transistor T1 in the aforementioned organic light emitting diode display according to the present example embodiment.

By way of summation and review, an organic light emitting diode display may include pixels that each include, for example, an organic light emitting diode including a cathode, an anode, and an organic emission layer. Circuits of each of the pixels may include, for example, a capacitor and transistors for driving the organic light emitting diode. A switching transistor, a driving transistor, a compensation transistor, etc., may be included in the respective pixel circuits.

As described above, embodiments may provide an organic light emitting diode display and a manufacturing method thereof, capable of improving switching capability of a switching transistor while maintaining a driving range of the driving transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a substrate;
   a scan line on the substrate to transfer a scan signal;
   a data line on the substrate to transfer a data signal;
   a switching transistor connected with the scan line and the data line;
   a driving transistor connected with the switching transistor; and
   an organic light emitting diode electrically connected to the driving transistor, wherein:
   the driving transistor includes a first semiconductor layer,
   the switching transistor includes a second semiconductor layer, and
   the first semiconductor layer has a surface roughness that is greater than that of the second semiconductor layer, the first semiconductor layer having RMS roughness of about 9 nm to about 15 nm, and the second semiconductor layer having RMS roughness of about 2 nm to about 7 nm.

2. The organic light emitting diode display as claimed in claim 1, wherein the first semiconductor layer has RMS roughness of about 10 nm to about 14 nm, and the second semiconductor layer has RMS roughness of about 5 nm to about 7 nm.

3. The organic light emitting diode display as claimed in claim 1, wherein the first semiconductor layer and the second semiconductor layer include a polysilicon.

4. The organic light emitting diode display as claimed in claim 3, wherein the switching transistor has an S-factor that is smaller than that of the driving transistor.

5. The organic light emitting diode display as claimed in claim 4, further comprising an insulating layer that covers the first semiconductor layer and the second semiconductor layer while contacting the first semiconductor layer and the second semiconductor layer.

6. The organic light emitting diode display as claimed in claim 1, further comprising:
   an emission control line configured to transfer an emission control signal; and
   an emission control transistor connected with the emission control line, the driving transistor, and the organic light emitting diode.

7. A manufacturing method of an organic light emitting diode display, the method comprising:
   forming an amorphous silicon layer on a substrate;
   forming a polysilicon layer by irradiating a first laser beam to the amorphous silicon layer;
   removing an oxidized layer positioned on the polysilicon layer;
   selectively irradiating a second laser beam to a second region of the polysilicon layer, where a second semiconductor layer of a second transistor is to be formed, while shielding a first region of the polysilicon layer, where a first semiconductor layer of a first transistor is to be formed, using a mask that exposes the second region; and
   forming an insulating layer on the polysilicon layer.

8. The manufacturing method as claimed in claim 7, wherein the selectively irradiating of the second laser beam includes disposing the mask on the polysilicon layer, and the mask is a metal mask.

9. The manufacturing method as claimed in claim 7, wherein:
   the second transistor is a switching transistor connected with a scan line for transferring a scan signal and a data line for transferring a data signal, and
   the first transistor is a driving transistor connected with the switching transistor.

10. The manufacturing method as claimed in claim 7, wherein the second region of the polysilicon layer is re-crystallized after being melted by irradiating the second laser beam thereto.

11. The manufacturing method as claimed in claim 10, wherein the first region of the polysilicon layer has RMS roughness of about 9 nm about to 15 nm, and the second region of the polysilicon layer has RMS roughness of about 2 nm to about 7 nm after being re-crystallized.

12. The manufacturing method as claimed in claim 7, wherein the second laser beam has an energy density that is about 80% to about 100% of that of the first laser beam.

13. The manufacturing method as claimed in claim 7, wherein the removing of the oxidized layer is performed by using a hydrogen fluoride solution.

14. An organic light emitting diode display, comprising:
   a substrate;
   a scan line on the substrate to transfer a scan signal;
   a data line on the substrate to transfer a data signal;
   a switching transistor connected with the scan line and the data line;
   a driving transistor connected with the switching transistor; and an organic light emitting diode electrically connected to the driving transistor, wherein:

the driving transistor includes a first semiconductor layer, the switching transistor includes a second semiconductor layer, the first semiconductor layer has a surface roughness that is greater than that of the second semiconductor layer, the first semiconductor layer and the second semiconductor layer include a polysilicon, and the switching transistor has an S-factor that is smaller than that of the driving transistor.

15. The organic light emitting diode display as claimed in claim 14, further comprising an insulating layer that covers the first semiconductor layer and the second semiconductor layer while contacting the first semiconductor layer and the second semiconductor layer.

16. The organic light emitting diode display as claimed in claim 14, further comprising:

an emission control line configured to transfer an emission control signal; and an emission control transistor connected with the emission control line, the driving transistor, and the organic light emitting diode.

\* \* \* \* \*